(12) United States Patent
Bulatowicz

(10) Patent No.: US 9,829,544 B2
(45) Date of Patent: Nov. 28, 2017

(54) MAGNETIC FIELD TRIMMING IN AN ATOMIC SENSOR SYSTEM

(71) Applicant: Michael D. Bulatowicz, Canoga Park, CA (US)

(72) Inventor: Michael D. Bulatowicz, Canoga Park, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 456 days.

(21) Appl. No.: 14/269,547

(22) Filed: May 5, 2014

(65) Prior Publication Data

US 2015/0316625 A1 Nov. 5, 2015

(51) Int. Cl.
G01V 3/00 (2006.01)
G01R 33/032 (2006.01)
G01R 33/26 (2006.01)
G01R 33/3875 (2006.01)

(52) U.S. Cl.
CPC .......... *G01R 33/032* (2013.01); *G01R 33/26* (2013.01); *G01R 33/3875* (2013.01)

(58) Field of Classification Search
CPC ... G01R 33/032; G01R 33/26; G01R 33/3875
USPC ....................................................... 324/304
See application file for complete search history.

(56) References Cited

U.S. PATENT DOCUMENTS

| 5,706,813 | A | 1/1998 | Filler et al. |
| 7,656,154 | B2 | 2/2010 | Kawabata et al. |
| 8,054,073 | B2 | 11/2011 | Tuchman |
| 8,212,556 | B1 | 7/2012 | Schwindt et al. |
| 9,116,201 | B2 * | 8/2015 | Shah ....................... G01R 33/26 |
| 9,121,889 | B2 * | 9/2015 | Tuchman ............. G01R 33/032 |
| 9,329,152 | B2 * | 5/2016 | Walker |
| 2007/0120563 | A1 * | 5/2007 | Kawabata .......... G01R 33/0354 |
| | | | 324/244.1 |
| 2009/0256561 | A1 | 10/2009 | Ledbetter et al. |
| 2009/0309682 | A1 | 12/2009 | Hall |
| 2010/0156419 | A1 * | 6/2010 | Sugioka ................. G01R 33/26 |
| | | | 324/318 |

(Continued)

FOREIGN PATENT DOCUMENTS

| JP | 2003273566 A | 9/2003 |
| JP | 2009300444 A1 | 12/2009 |
| JP | 2013217690 A | 10/2013 |

OTHER PUBLICATIONS

International Search Report for corresponding PCT/US15/30829 dated Aug. 12, 2015; Completed by Lee W. Young on Jul. 27, 2015.

(Continued)

*Primary Examiner* — Susan Lee
(74) *Attorney, Agent, or Firm* — Tarolli, Sundheim, Covell & Tummino LLP

(57) ABSTRACT

One example embodiment includes an atomic sensor system. The system includes a magnetic field generator configured to generate a magnetic field in a volume. The system also includes a vapor cell arranged within the volume and comprising a polarized alkali metal vapor. The system further includes at least one magnetic field trimming system configured to generate a magnetic field gradient within the vapor cell separate from the magnetic field to provide a substantially uniform collective magnetic field within the vapor cell.

20 Claims, 5 Drawing Sheets

(56) References Cited

U.S. PATENT DOCUMENTS

| | | | |
|---|---|---|---|
| 2010/0289491 A1* | 11/2010 | Budker | G01R 33/26 324/304 |
| 2011/0279115 A1 | 11/2011 | Tuchman | |
| 2012/0191396 A1 | 7/2012 | Griffith et al. | |
| 2013/0229173 A1 | 9/2013 | Bertrand | |
| 2013/0265042 A1* | 10/2013 | Kawabata | G01R 33/26 324/301 |
| 2013/0278253 A1* | 10/2013 | Ichihara | G01R 33/26 324/304 |
| 2013/0278265 A1* | 10/2013 | Kim | G01R 33/445 324/318 |
| 2013/0328557 A1* | 12/2013 | Larsen | G01R 33/26 324/304 |
| 2014/0009149 A1 | 1/2014 | Korth et al. | |
| 2014/0247045 A1* | 9/2014 | Kornack | G01R 33/26 324/304 |
| 2014/0354275 A1* | 12/2014 | Sheng | G01R 33/26 324/244.1 |
| 2015/0241217 A1* | 8/2015 | Bulatowicz | G01C 19/60 324/309 |

OTHER PUBLICATIONS

Fescenko, et al. "Imaging Magnetic Scalar Potentials by Laser-Induced Fluorescence from Bright and Dark Atoms." *Journal of Physics D: Applied Physics*, vol. 47, Issue 23, pp. 1-20 (2014): 235001.

Savukov I M, et al: "Detectoin of NMR Signals with a Radio-Frequency Atomic Magnetometer" ARXIV.ORG, Cornell University, Ithaca, NY 14853, Nov. 6, 2006, XP080263326, DOI: 102016/J.JMR.2006,12,012; p. 2 left-hand column, paragraph 2—right-hand column, paragraph 1.

Supplementary Search Report issued Mar. 6, 2017 for corresponding EP 15741471.5-1568.

Japanese Office Action dated Sep. 19, 2017 for corresponding JP 2016-544367.

* cited by examiner

MAGNETIC FIELD TRIMMING IN AN ATOMIC SENSOR SYSTEM

TECHNICAL FIELD

The present invention relates generally to sensor systems, and specifically to magnetic field trimming in an atomic sensor system.

BACKGROUND

Atomic sensors, such as nuclear magnetic resonance (NMR) gyroscopes and atomic magnetometers, employ optical beams to operate, such as to detect rotation about a sensitive axis or to detect the presence and magnitude of an external magnetic field. As an example, an NMR sensor system can employ a first optical beam as a pump beam and a second optical beam as a probe beam. For example, the pump beam can be a circularly-polarized optical beam that is configured to spin-polarize a vapor, such as cesium (Cs) or rubidium (Rb), within a sealed vapor cell of the sensor. The magnetic field can be generated by a magnetic solenoid to induce precession of alkali metal isotopes. The interaction between the polarized alkali metal vapor and the nuclear spin isotopes in the vapor cell gives rise to an effective magnetic field experienced by the nuclear spin isotopes based on the alkali number density and alkali fractional polarization. The greater the product of alkali number density and alkali fractional polarization, the greater the alkali magnetic field experienced by the nuclear spin isotopes.

SUMMARY

One example embodiment includes an atomic sensor system. The system includes a magnetic field generator configured to generate a magnetic field in a volume. The system also includes a vapor cell arranged within the volume and comprising a polarized alkali metal vapor. The system further includes at least one magnetic field trimming system configured to generate a magnetic field gradient within the vapor cell separate from the magnetic field to provide a substantially uniform collective magnetic field within the vapor cell.

Another embodiment includes a method for generating a substantially uniform collective magnetic field in a vapor cell of an atomic sensor. The method includes generating a circularly-polarized optical pump beam via a pump laser. The method also includes generating a magnetic field in a volume that subsumes a vapor cell comprising an alkali metal vapor that is spin-polarized in response to the optical pump beam, and generating a local magnetic field within the vapor cell. The method further includes generating at least one magnetic field gradient within the vapor cell separate from the magnetic field. The magnetic field gradient can have an intensity that is substantially equal and opposite the local magnetic field to provide the substantially uniform collective magnetic field in the vapor cell.

Another embodiment includes an atomic sensor system. The system includes a pump laser configured to generate an optical pump beam. The system also includes a magnetic field generator configured to generate a magnetic field in a volume. The system also includes a vapor cell arranged within the volume and comprising an alkali metal vapor that is spin-polarized in response to the optical pump beam. The system also includes a first magnetic field trimming system configured to generate a first magnetic field gradient independent of the magnetic field having a greatest intensity proximal to at least one internal side-edge of the vapor cell and decreasing away from the at least one internal side-edge. The system also includes a second magnetic field trimming system configured to generate a second magnetic field gradient independent of the magnetic field having a greatest intensity at an internal edge of a first end of the vapor cell that is orthogonal to the optical pump beam and decreasing away from the internal edge of the first end of the vapor cell. The system further includes a third magnetic field trimming system configured to generate a third magnetic field gradient independent of the magnetic field having a greatest intensity at an internal edge of a second end of the vapor cell opposite the first end and decreasing away from the internal edge of the second end of the vapor cell.

DETAILED DESCRIPTION

Figure 1:
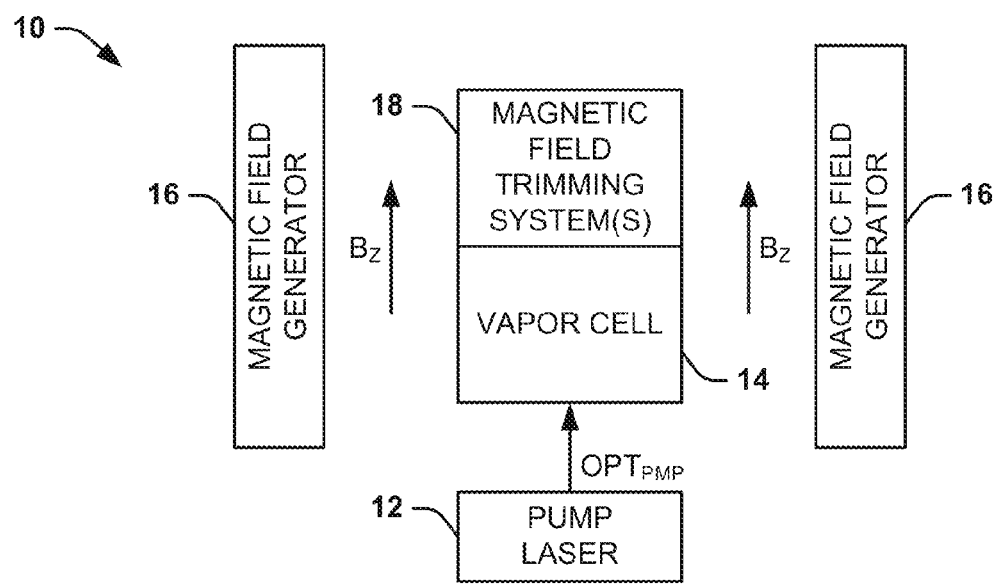
FIG. 1 illustrates an example of an atomic sensor system.

The present invention relates generally to sensor systems, and specifically to magnetic field trimming in an atomic sensor system. An atomic sensor system, such as a nuclear magnetic resonance (NMR) gyroscope or atomic magnetometer, can include a vapor cell that includes an alkali metal vapor and at least one nuclear isotope (e.g., xenon (Xe)). The system can also include a magnetic field generator that is configured to generate a magnetic field within a volume that subsumes the vapor cell along a sensitive axis, and a pump laser (e.g., a vertical-cavity surface-emitting laser (VCSEL)) configured to generate a circularly-polarized optical pump beam along the sensitive axis. The optical pump beam can be configured to spin-polarize the atoms in the alkali metal vapor. As a result of an interaction between the polarized alkali metal vapor and the at least one nuclear isotope, a local magnetic field within the vapor cell can be induced on the at least one nuclear isotope based on characteristics of the alkali metal vapor (e.g., alkali number density and/or alkali fractional polarization).

In the vapor cell, the alkali polarization lifetime can typically be substantially less than a diffusion time across the vapor cell, and can primarily be limited by spin-exchange with the nuclear isotopes. For example, the spin of the atoms of the alkali metal vapor can become depolarized at a high rate as a result of polarizing the nuclear isotopes through spin-exchange processes. The rate of polarization of the atoms of the alkali metal vapor in any given portion of the vapor cell can therefore be a strong function of the local intensity of the optical pump beam. For example, a greater local light intensity can lead to a greater rate of polarization of the local atoms of the alkali metal vapor. The alkali metal atoms can become polarized through absorption of circularly polarized photons from the optical pump beam, such that the atoms absorb the angular momentum of these photons as they absorb the photons themselves. The energy of a photon is either emitted as another photon (e.g., with a random angular momentum state) or transferred via excited state quenching with a buffer gas (e.g., nitrogen) in the vapor cell. Such a process can lead to absorption of the pump light and a resulting decrease in local intensity as the optical pump beam propagates through the vapor cell. As a result, away from the vapor cell walls, the local alkali fractional polarization can drop off with increasing distance from the source of the optical pump beam. Additional polarization gradients can also result from any non-uniform distribution of optical pump beam in the vapor cell, such that a Gaussian light intensity profile (e.g., such as can be typical from a VCSEL), can result in a corresponding non-linear near-Gaussian alkali polarization gradient across the field of the optical pump beam.

Additional depolarization effects on the atoms of the alkali metal vapor can occur at the walls of the vapor cell. For example, alkali metal atoms which collide with the cell walls can become effectively depolarized through strong spin-exchange interaction with the walls. As a result, the local alkali fractional polarization can be reduced to effectively zero. Based on diffusion and optical pumping effects, this depolarization of the alkali metal atoms at the vapor cell walls can result in an alkali metal polarization gradient. Furthermore, the depolarization of the alkali metal atoms at the vapor cell walls can provide for the fractional absorption of the photons of the optical pump beam near the vapor cell walls to be greater than toward the center of the vapor cell.

A primary contributor to fundamental noise processes and sensitivity to unintended measurement error sources in an associated atomic sensor system can be a transverse spin relaxation time of the one or more nuclear isotopes. The transverse spin relaxation time can be affected by multiple influencing factors, such as magnetic field gradients in the vapor cell. An ideal magnetic field that is provided by the magnetic field generator will be perfectly uniform, and thus will not induce any decoherence of an ensemble of spins of the nuclear isotopes as they precess about the applied magnetic field within the vapor cell. As described previously, the local magnetic field at any point in space within the vapor cell can be proportional to characteristics of the alkali metal vapor, such as the product of alkali vapor number density and alkali fractional polarization. Therefore, a gradient in the alkali fractional polarization described previously can give rise to gradients in the local magnetic field, such as can reduce the transverse spin relaxation times of the nuclear isotopes through gradient-induced decoherence of the spin ensemble. As a result, performance of the atomic sensor system in calculating a measurable parameter (e.g., rotation about a sensitive axis or a magnitude of an external magnetic field) can be compromised as a result of the nuclear isotope spin decoherence resulting from non-uniformity of the local magnetic in the vapor cell.

To provide for a substantially uniform local magnetic field in the vapor cell, the atomic sensor system also includes at least one magnetic field trimming system configured to generate a magnetic field gradient in the vapor cell. As an example, the magnetic field gradient that is generated by the at least one magnetic field trimming system can be approximately equal and opposite the local magnetic field gradient, such that the collective magnetic field in the vapor cell is substantially uniform. For example, the atomic sensor system can include a first magnetic field trimming system configured to generate a first magnetic field gradient having a greatest intensity proximal to at least one internal side-edge of the vapor cell and decreasing away from the at least one internal side-edge, a second magnetic field trimming system configured to generate a second magnetic field gradient independent of the magnetic field having a greatest intensity at an internal edge of a first end of the vapor cell that is orthogonal to the optical pump beam and decreasing away from the internal edge of the first end of the vapor cell, and a third magnetic field trimming system configured to generate a third magnetic field gradient independent of the magnetic field having a greatest intensity at an internal edge of a second end of the vapor cell opposite the first end and decreasing away from the internal edge of the second end of the vapor cell. Each of the magnetic field trimming systems can include a first coil and a second coil that are coaxial and arranged in series to conduct a current in opposite directions with respect to each other to generate respective magnetic field gradients. Accordingly, the magnetic field trimming systems can collectively generate a magnetic field gradient that is approximately equal and opposite the local magnetic field gradient, and can therefore provide for a substantially uniform magnetic field in the vapor cell.

FIG. 1 illustrates an example of an atomic sensor system 10. The atomic sensor system 10 can correspond to any of a variety of NMR sensors, such as an NMR gyroscope that is configured to measure rotation about a sensitive axis or an atomic magnetometer that is configured to measure an intensity of an externally provided magnetic field. The atomic sensor system 10 can thus be provided in any of a variety of applications, such as navigation and/or defense applications.

The atomic sensor system 10 includes a pump laser 12 configured to generate an optical pump beam $OPT_{PMP}$. The optical pump beam $OPT_{PMP}$ can be, for example, circularly-polarized, and is provided through a vapor cell 14 that includes an alkali metal vapor, such as rubidium (Rb) or cesium (Cs), as well as one or more nuclear spin isotopes, such as an isotope of a noble gas (e.g., xenon (Xe)). For example, the optical pump beam $OPT_{PMP}$ can be provided approximately parallel (e.g., collinearly) with a sensitive axis of the atomic sensor system 10. For example, an optical probe beam (not shown) can likewise be provided through the vapor cell 14, such as orthogonally with respect to the optical pump beam $OPT_{PMP}$, to calculate a magnitude of an external magnetic field in the example of the atomic sensor system 10 being configured as an atomic magnetometer, or to calculate rotation about a sensitive axis in the example of the atomic sensor system 10 being configured as an NMR gyroscope. The optical pump beam $OPT_{PMP}$ can be configured to spin-polarize the alkali metal atoms in the vapor cell 14.

The atomic sensor system 10 also includes a magnetic field generator 16 that is configured to generate a magnetic field $B_Z$ along the axis with the optical pump beam $OPT_{PMP}$. As an example, the magnetic field generator 16 can be configured as a magnetic solenoid that generates the magnetic field $B_Z$ in a volume that subsumes the vapor cell 14. The magnetic field $B_Z$ can be configured as an AC magnetic field (e.g., including a DC offset). Therefore, the magnetic field $B_Z$ can stimulate precession of the vapor particles in the vapor cell 14 in a resonant condition to substantially amplify the modulation of the polarization vector of the vapor particles in the vapor cell 14 in response to magnetic fields applied orthogonally with respect to the optical pump beam OPT$_{PMP}$ (e.g., external orthogonal magnetic field components). The precession of the vapor particles in the vapor cell 14 can thus provide an indication of the measurable parameter associated with the atomic sensor system 10, such as based on a Faraday rotation of the associated optical probe beam provided through the vapor cell 14.

As described previously, interactions between the spin-polarized alkali metal vapor atoms and the nuclear isotopes can result in an induced local magnetic field within the vapor cell 14 based on characteristics of the alkali metal vapor, such as alkali number density and/or alkali fractional polarization. For example, a larger magnitude product of the alkali number density and the alkali fractional polarization of the alkali metal vapor in the vapor cell 14 can result in a larger magnitude of the local magnetic field experienced by the nuclear isotopes in the vapor cell 14. However, as also described previously, such local magnetic field can be exhibited as a local magnetic field gradient based on depolarization of the alkali metal atoms in response to intensity variation of the optical pump beam OPT$_{PMP}$ across a cross-section of the vapor cell 14 and in response to interaction of the alkali metal atoms near the inside edges of the walls of the vapor cell 14. Therefore, such local magnetic field gradients, such as having a greatest intensity near the center of a cross-section of the vapor cell 14 orthogonal to the optical pump beam OPT$_{PMP}$ and/or having a lowest intensity near the corners or edges of the walls of the vapor cell 14 can result in decoherence of the spin polarization of the nuclear isotopes therein, which can provide errors in the calculation of the measurable parameter of the atomic sensor system 10.

In the example of FIG. 1, the atomic sensor system 10 includes at least one magnetic field trimming system 18 that is configured to collectively generate a magnetic field gradient in the vapor cell 14 independently of the magnetic field B$_Z$ generated by the magnetic field generator 16. For example, the collective magnetic field gradient that is generated by the magnetic field trimming system(s) can correspond to one or more respective magnetic field gradients that are provided to substantially counteract local magnetic field gradient(s) in the vapor cell 14, such as resulting from diffusion and/or spin-depolarization of the atoms of the alkali metal vapor in the vapor cell 14 and/or intensity variations of the optical pump beam OPT$_{PMP}$ with respect to the volume of the vapor cell 14. Therefore, the magnetic field trimming system(s) 18 can include separate sets of coils that can conduct respective currents to generate individual magnetic field gradients in the vapor cell 14. As an example, each of the magnetic field trimming system(s) 18 can include a first coil and a second coil that are coaxial and arranged in series to conduct a current in opposite directions with respect to each other to generate the respective magnetic field gradients. Accordingly, the generated collective magnetic field gradient can offset the local magnetic field gradients in the vapor cell 14 that can result from each of the potential sources of the respective local magnetic field gradients to be substantially equal and opposite the local magnetic field gradient(s).

Figure 2:
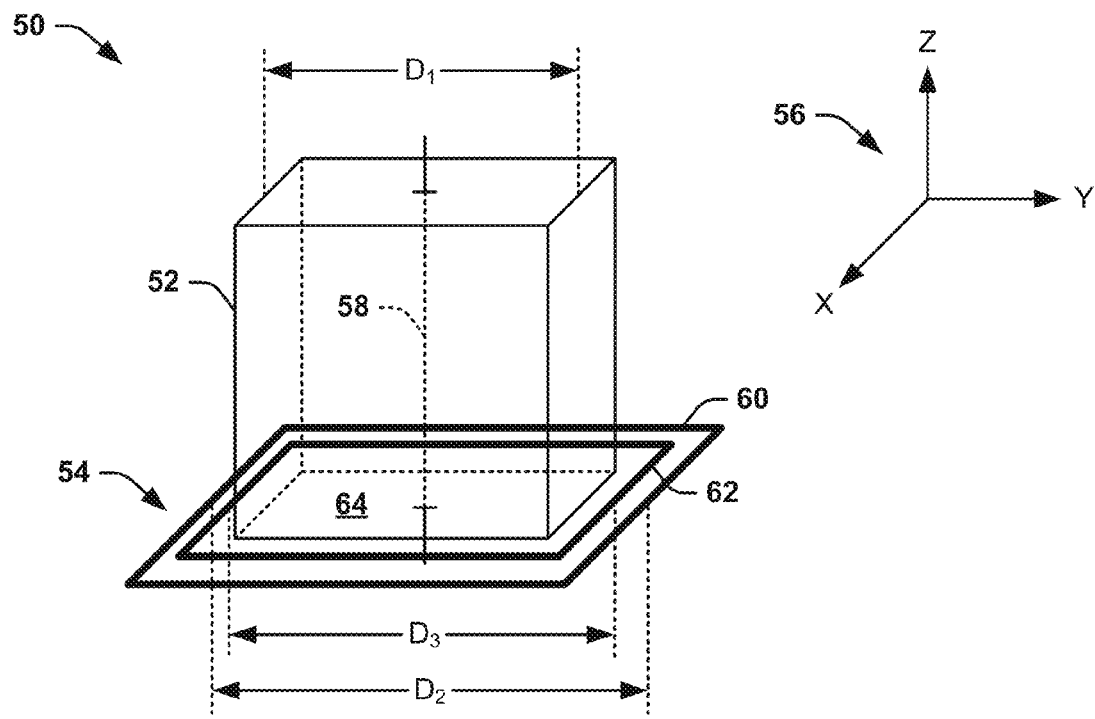
FIG. 2 illustrates another example of an atomic sensor system.

FIG. 2 illustrates another example of an atomic sensor system 50. The atomic sensor system 50 includes a vapor cell 52 and a magnetic field trimming system 54. As an example, the vapor cell 52 can correspond to the vapor cell 14 and the magnetic field trimming system 54 can correspond to one of the at least one magnetic field trimming system 18 in the example of FIG. 1. Therefore, reference is to be made to the example of FIG. 1 in the following description of the example of FIG. 2.

The vapor cell 52 is demonstrated as having a rectangular cuboid (e.g., approximately cubic) shape. In the example of FIG. 2, the vapor cell 52 has a width dimension D$_1$ along the Y-axis, as demonstrated by the Cartesian coordinate system 56. As an example, the width dimension D$_1$ can also be the width of the vapor cell 52 along the X-axis, such that the vapor cell 52 has a square cross-sectional shape. Similar to as described previously, the vapor cell 52 includes an alkali metal vapor that can be spin-polarized via the optical pump beam OPT$_{PMP}$, and can thus be caused to precess via the magnetic field B$_Z$. As an example, the optical pump beam OPT$_{PMP}$ can be provided along a sensitive axis of the atomic sensor system 50, demonstrated in the example of FIG. 2 as the central axis 58 along the Z-axis.

The magnetic field trimming system 54 includes a first coil 60 and a second coil 62. The first and second coils 60 and 62 are arranged in a coplanar arrangement that, in the example of FIG. 2, is likewise coplanar with a first end 64 of the vapor cell 52. As described herein, the term "coil" with respect to a magnetic field trimming system refers to a single or multiple loops of a conductor configured to conduct a current, and thus generate a respective magnetic field. In the example of FIG. 2, the first coil 60 has a width dimension D$_2$ and the second coil 62 has a width dimension D$_3$, with each of the width dimensions D$_2$ and D$_3$ being greater than the width dimension D$_1$ of the vapor cell 52. The first coil 60 and the second coil 62 can be arranged in series with respect to each other, such that they each conduct the same current that can propagate in opposite directions with respect to each other around the central axis 58. As a result, the number of loops of the first and second coils 60 and 62, as well as the width dimensions D$_2$ and D$_3$, can be selected to generate respective magnetic fields in separate directions and having separate magnetic moments and magnetic flux densities with respect to the vapor cell 52. Accordingly, the first and second coils 60 and 62 can collectively generate a magnetic field gradient in the vapor cell 52, such as to substantially counteract at least one source of local magnetic field gradient within the vapor cell 52 based on interaction of the alkali metal atoms in the vapor cell 52 with the walls of the vapor cell 52 and/or with the optical pump beam OPT$_{PMP}$.

Figure 3:
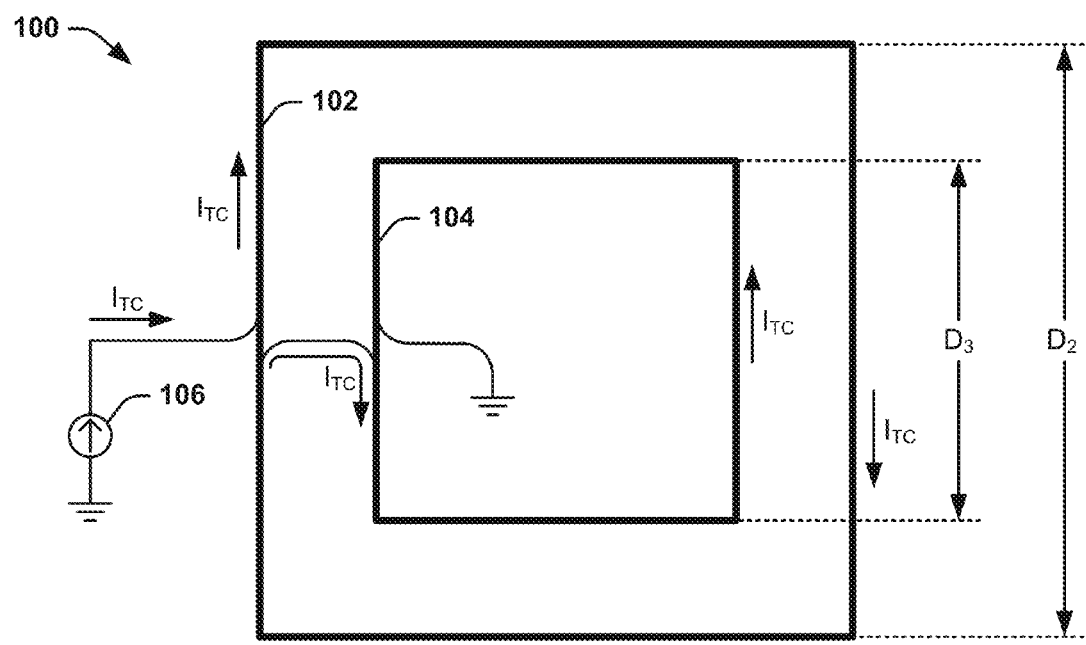
FIG. 3 illustrates an example of a magnetic field trimming system.

FIG. 3 illustrates an example of a magnetic field trimming system 100. The magnetic field trimming system 100 can correspond, for example, to the magnetic field trimming system 54 in the example of FIG. 2. The magnetic field trimming system 100 includes a first coil 102 and a second coil 104 that can each include one or more conductive loops that are arranged in a rectangular (e.g., square) geometric shape, which can thus be equivalent to a geometric shape of a cross-section of the vapor cell 52. The first and second coils 102 and 104 are arranged in a coplanar arrangement that can likewise be coplanar with the first end 64 of the vapor cell 52, as described previously. In the example of FIG. 3, the first coil 102 has the width dimension D$_2$ and the second coil 104 has the width dimension D$_3$, with each of the width dimensions D$_2$ and D$_3$ being greater than the width dimension D$_1$ of the vapor cell 52. The magnetic field trimming system 100 includes a current source 106 (e.g., a voltage source and a resistor) that is configured to generate a current I$_{TC}$ that is provided through each of the first and second coils 102 and 104. As demonstrated in the example, the first and second coils 102 and 104 are arranged in series with respect to each other, such that they each conduct the current I$_{TC}$. Additionally, the first coil 102 propagates the current I$_{TC}$ in a clockwise direction while the second coil 104 propagates the current I$_{TC}$ in a counter-clockwise direction, such that the current $I_{TC}$ propagates in opposite directions with respect to the first and second coils 102 and 104, then to a low-voltage rail (e.g., ground). As described previously, the number of loops of the first and second coils 102 and 104, as well as the width dimensions $D_2$ and $D_3$, can be selected to generate respective magnetic fields in separate directions and having separate magnetic moments and magnetic flux densities with respect to the vapor cell 52.

Figure 4:
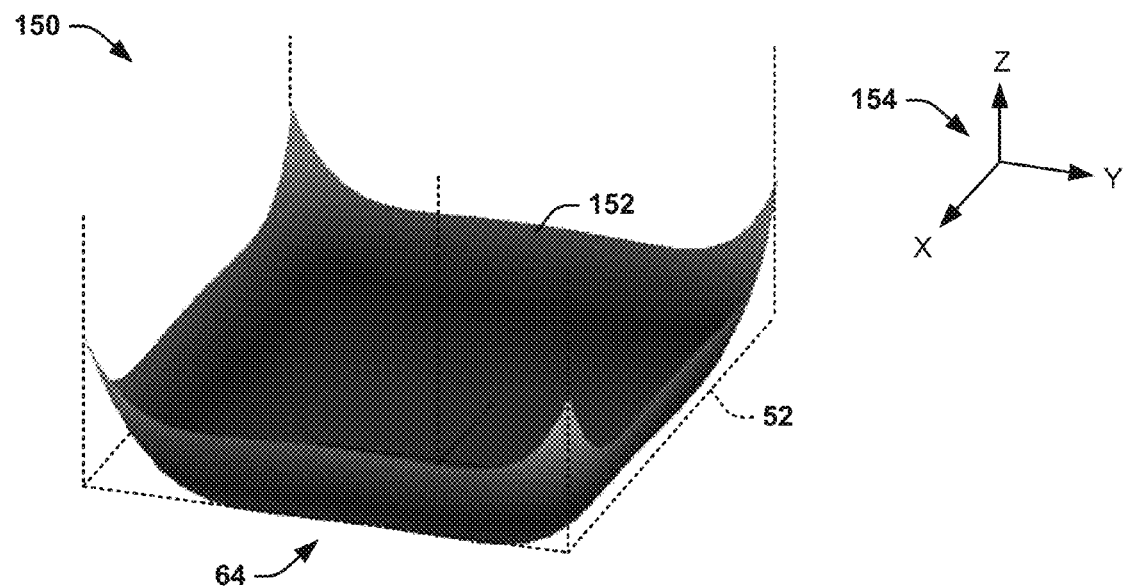
FIG. 4 illustrates an example diagram of a magnetic field gradient.

As an example, the optical pump beam $OPT_{PMP}$ can be generated to have an intensity that is substantially uniform across the cross-section of the vapor cell 54 (e.g., across the width dimension $D_1$). FIG. 4 illustrates an example diagram 150 of a magnetic field gradient 152. The magnetic field gradient 152 can be generated, for example, from the magnetic field system 100. In the example of FIG. 4, the magnetic field gradient 152 is demonstrated three-dimensionally in an X-Y-Z Cartesian coordinate axis 154, such as at the first end 64 of the vapor cell 52. The magnetic field gradient 152 is demonstrated as having a greatest intensity at the corners of the first end 64 of the vapor cell 52, with an intensity that decreases away from the corners. Because the optical pump beam $OPT_{PMP}$ can be generated to have a substantially uniform intensity across the cross-section of the vapor cell 54, the intensity of the magnetic field gradient can decrease to an approximately uniform intensity toward the center of the cross-section of the vapor cell 52. As an example, the magnetic field gradient 152 can be approximately equal and opposite a local magnetic field gradient that is generated based on depolarization of the alkali metal atoms based on interaction of the alkali metal atoms with the walls and corners of the vapor cell 52.

Figure 5:
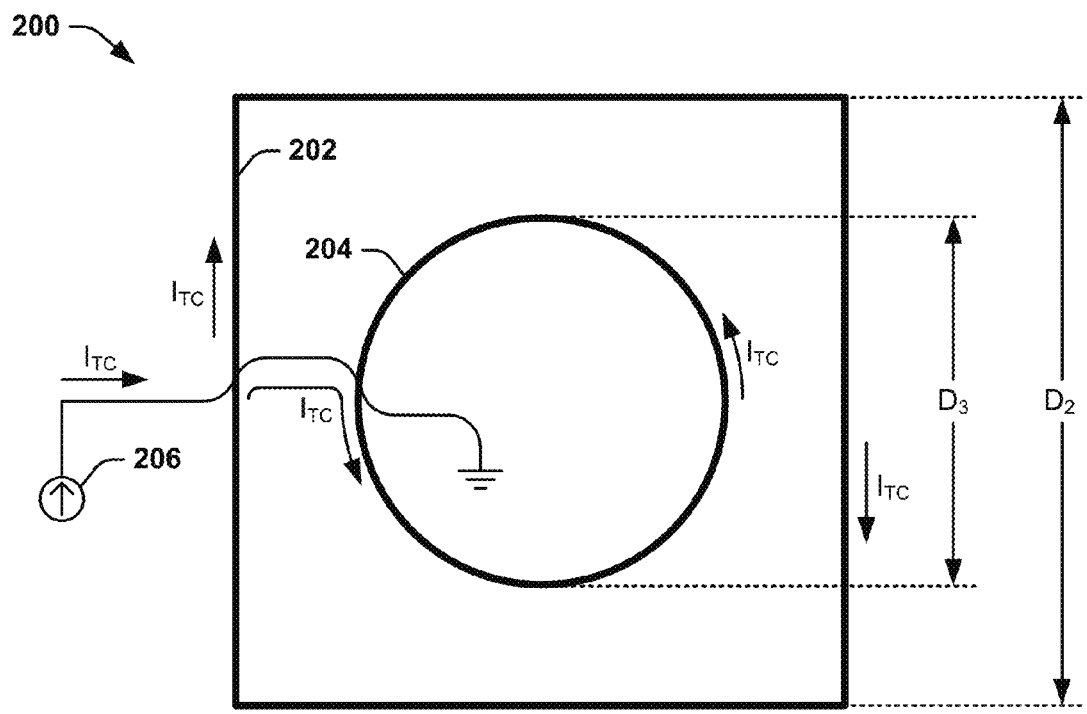
FIG. 5 illustrates another example of a magnetic field trimming system.

As another example, the optical pump beam $OPT_{PMP}$ can be generated to have an intensity that is substantially Gaussian across the cross-section of the vapor cell 54 (e.g., across the width dimension $D_1$). FIG. 5 illustrates an example of a magnetic field trimming system 200. The magnetic field trimming system 200 can correspond, for example, to the magnetic field trimming system 54 in the example of FIG. 2. Similar to as described previously regarding the example of FIG. 3, the magnetic field trimming system 200 includes a first coil 202 and a second coil 204 that can each include one or more conductive loops that are arranged in a coplanar arrangement (e.g., likewise coplanar with the first end 64 of the vapor cell 52). However, in the example of FIG. 5, the first coil 202 is demonstrated as having a rectangular (e.g., square) geometric shape while the second coil 204 is demonstrated as having a round geometric shape. Thus, in the example of FIG. 5, the first coil 202 has a width dimension $D_2$ and the second coil 104 has a diameter dimension $D_3$. As an example, each of the width dimensions $D_2$ and $D_3$ can be greater than the width dimension $D_1$ of the vapor cell 52.

Similar to as described previously regarding the example of FIG. 3, the magnetic field trimming system 200 includes a current source 206 (e.g., a voltage source and a resistor) that is configured to generate a current $I_{TC}$ that is provided through each of the first and second coils 202 and 204. As demonstrated in the example, the first and second coils 102 and 104 are arranged in series with respect to each other, such that they each conduct the current $I_{TC}$. Additionally, the first coil 202 propagates the current $I_{TC}$ in a clockwise direction while the second coil 204 propagates the current $I_{TC}$ in a counter-clockwise direction, such that the current $I_{TC}$ propagates in opposite directions with respect to the first and second coils 202 and 204, then to a low-voltage rail (e.g., ground). As described previously, the number of loops of the first and second coils 102 and 104, as well as the dimensions $D_2$ and $D_3$, can be selected to generate respective magnetic fields in separate directions and having separate magnetic moments and magnetic flux densities with respect to the vapor cell 52. Additionally, because the second coil 204 has a round geometric shape, the magnetic field trimming system 200 can be configured to generate the magnetic field gradient in a reverse-Gaussian manner to substantially counteract the local magnetic field gradient in the vapor cell 52 resulting from the Gaussian distribution of the optical pump beam $OPT_{PMP}$.

Figure 6:
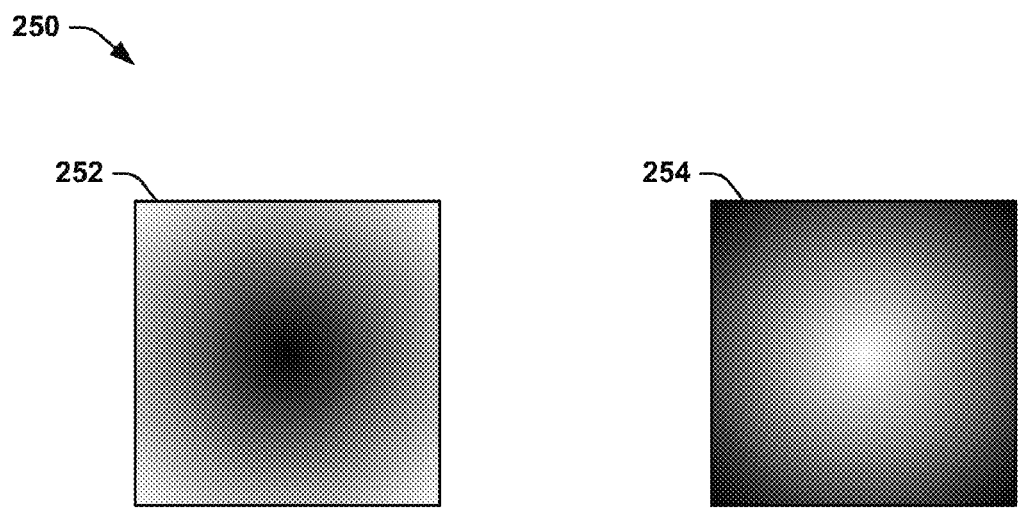
FIG. 6 illustrates an example diagram of cross-sectional views of magnetic field gradients.

FIG. 6 illustrates an example diagram 250 of cross-sectional views of magnetic field gradients. The diagram 250 includes a first magnetic field gradient 252 and a second magnetic field gradient 254 that are distributed across a cross-section of the vapor cell 52 orthogonal to the central axis 64 (i.e., the X-Y plane). The first magnetic field gradient 252 can correspond to the local magnetic field gradient that results, at least in part, from the Gaussian distribution of the optical pump beam $OPT_{PMP}$ (e.g., in addition to interaction with the walls of the vapor cell 52). The second magnetic field gradient 254 can correspond, for example, to the magnetic field gradient generated by the magnetic field trimming system 200 in the example of FIG. 5. In the example of FIG. 6, the diagram 250 demonstrates greater magnetic field intensities at darker shaded portions of the magnetic field gradients 252 and 254 and lesser magnetic field intensities at lighter shaded portions of the magnetic field gradients 252 and 254.

The first magnetic field gradient 252 thus demonstrates the local magnetic field having a greatest intensity at the approximate center of the cross-section of the vapor cell 52 and having decreasing intensity away from the approximate center, with a least intensity at the corners of the cross-section of the vapor cell 52. Similarly, second magnetic field gradient 254 demonstrates the magnetic field generated by the magnetic field trimming system 200 having a least intensity at the approximate center of the cross-section of the vapor cell 52 and having increasing intensity away from the approximate center, with a greatest intensity at the corners of the cross-section of the vapor cell 52. Accordingly, the second magnetic field gradient 254 can be generated approximately equal and opposite the first magnetic field gradient 252 that results from depolarization of the alkali metal atoms in response to the Gaussian distribution of the optical pump beam $OPT_{PMP}$ to provide a substantially uniform magnetic field in the vapor cell 52.

It is to be understood that the magnetic field trimming system 200 can be implemented on vapor cells having geometric shapes that are different from the vapor cell 52. For example, the vapor cell 52 could have a cylindrical shape, and thus a round cross-sectional shape. Thus, the magnetic field trimming system 200 can be configured to generate the magnetic field gradient 254 having a substantially uniform and greatest intensity magnetic field at the inside of the wall of the vapor cell 52 and decreasing to a least intensity at the approximate center of the cross-section to substantially counteract the local magnetic field in the vapor cell 52. Additionally, the magnetic field trimming system 200 can be configured differently for a round cross-section vapor cell, such as based on the first and second coils 202 and 204 both having a round geometric shape. Therefore, the magnetic field trimming system 200 can be configured to have at least one coil that has a geometric shape that is approximately the same as a geometric shape of the cross-section of the associated vapor cell.

Figure 7:
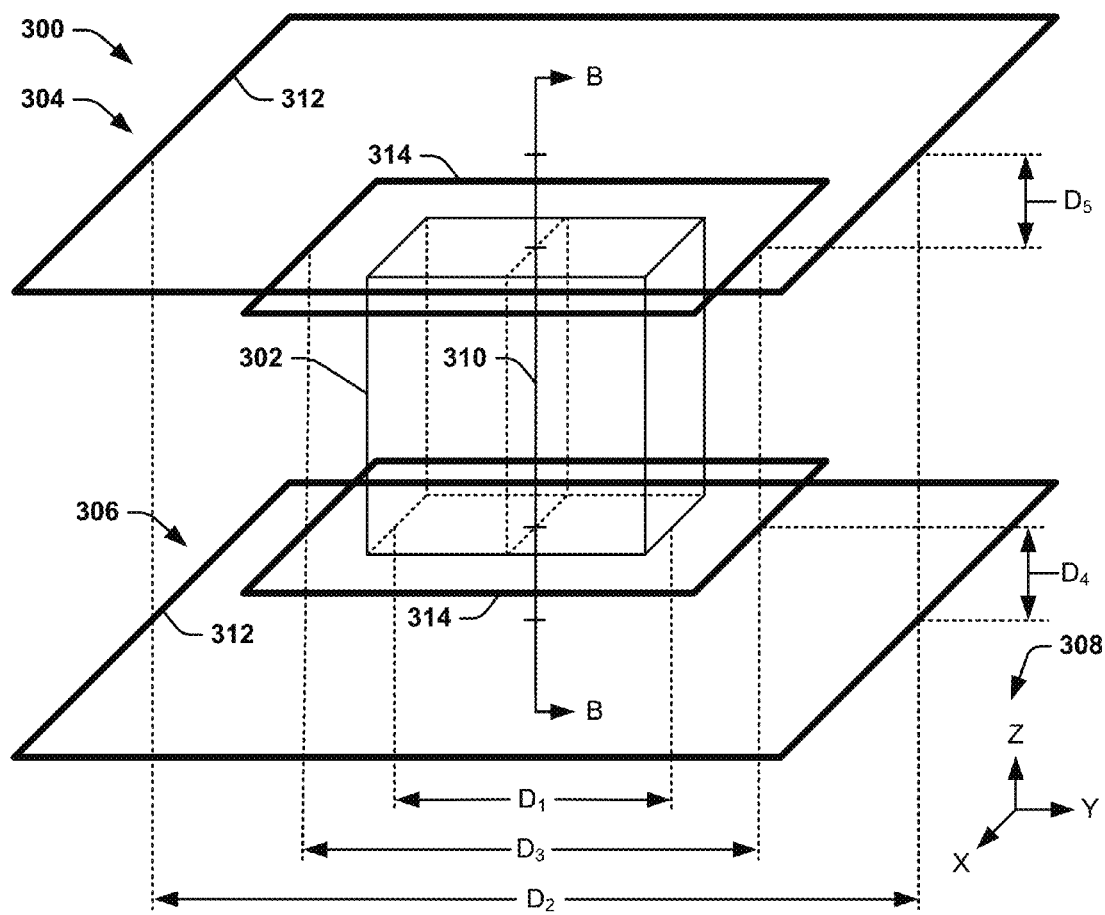
FIG. 7 illustrates yet another example of an atomic sensor system.

FIG. 7 illustrates yet another example of an atomic sensor system 300. The atomic sensor system 300 includes a vapor cell 302, a first magnetic field trimming system 304 and a second magnetic field trimming system 306. As an example, the vapor cell 302 can correspond to the vapor cell 14 and the magnetic field trimming systems 304 and 306 can correspond to two of the at least one magnetic field trimming system 18 in the example of FIG. 1. Therefore, reference is to be made to the example of FIG. 1 in the following description of the example of FIG. 7.

The vapor cell 302 is demonstrated as having a rectangular cuboid (e.g., approximately cubic) shape, but could instead have one of a variety of other shapes (e.g., cylindrical). In the example of FIG. 7, the vapor cell 302 has a width dimension $D_1$ along the Y-axis, as demonstrated by the Cartesian coordinate system 308. As an example, the width dimension $D_1$ can also be the width of the vapor cell 302 along the X-axis, such that the vapor cell 302 has a square cross-sectional shape. Similar to as described previously, the vapor cell 302 includes an alkali metal vapor that can be spin-polarized via the optical pump beam $OPT_{PMP}$, and can thus be caused to precess via the magnetic field $B_Z$. As an example, the optical pump beam $OPT_{PMP}$ can be provided along a sensitive axis of the atomic sensor system 300, demonstrated in the example of FIG. 7 as the central axis 310 along the Z-axis.

Each of the first and second magnetic field trimming systems 304 and 306 include a first coil 312 and a second coil 314 that are each coaxial with respect to the central axis 310. In the example of FIG. 7, the first coil 312 has a width dimension $D_2$ and the second coil 314 has a width dimension $D_3$, with each of the width dimensions $D_2$ and $D_3$ being greater than the width dimension $D_1$ of the vapor cell 302. As an example, the width dimensions $D_2$ and $D_3$ can be greater than the width dimensions $D_2$ and $D_3$, respectively, of the magnetic field trimming system 52 in the example of FIG. 2, such as significantly greater than the width dimension $D_1$ (e.g., approximately four times or more the width dimension $D_1$). Additionally, the width dimensions $D_2$ and $D_3$ in each of the magnetic field trimming systems 302 and 304 may be different for the first magnetic field trimming system 302 relative to the second magnetic field trimming system 304. In the example of FIG. 7, the first and second coils 312 and 314 in the first magnetic field trimming system 304 are arranged near a first end 316 of the vapor cell 302 and are offset by a distance D4. Similarly, the first and second coils 312 and 314 in the second magnetic field trimming system 306 are arranged near a second end 318 of the vapor cell 302 and are offset by a distance D5. The location of the first and second coils 312 and 314 relative to the first and second ends 316 and 318 can be, for example, between the respective distances D4 and D5, or can be outside of the span of the distances D4 and D5.

Similar to as described previously, the first coil 312 and the second coil 314 can be arranged in series with respect to each other, such that they each conduct the same current that can propagate in opposite directions with respect to each other around the central axis 310, similar to as demonstrated in the example of FIG. 3. As a result, the number of loops of the first and second coils 312 and 314, as well as the width dimensions $D_2$ and $D_3$ and the respective distance D4 or the respective distance D5, can be selected to generate respective magnetic fields in separate directions and having separate magnetic moments and magnetic flux densities with respect to the vapor cell 302. For example, the first coil 312 of each of the first and second magnetic field trimming systems 304 and 306 can be configured to provide a magnetic field having a greater magnetic moment, and the second coil 314 of each of the first and second magnetic field trimming systems 304 and 306 can be configured to provide a magnetic field having a greater magnetic flux density. Accordingly, the first and second magnetic field trimming systems 304 and 306 can each generate separate magnetic field gradients in the vapor cell 302, such as to substantially counteract a local magnetic field gradient within the vapor cell 302 based on interaction of the alkali metal atoms in the vapor cell 302 with the walls of the vapor cell 302 through which the optical pump beam $OPT_{PMP}$ passes and/or diffusion of the alkali metal atoms in the vapor cell 302. In addition, it is to be understood that the first and second magnetic field trimming systems 304 and 306 can be configured differently with respect to dimensions and attributes of the respective first and second coils 312 and 314 to generate magnetic field gradients having respective different characteristics.

Figure 8:
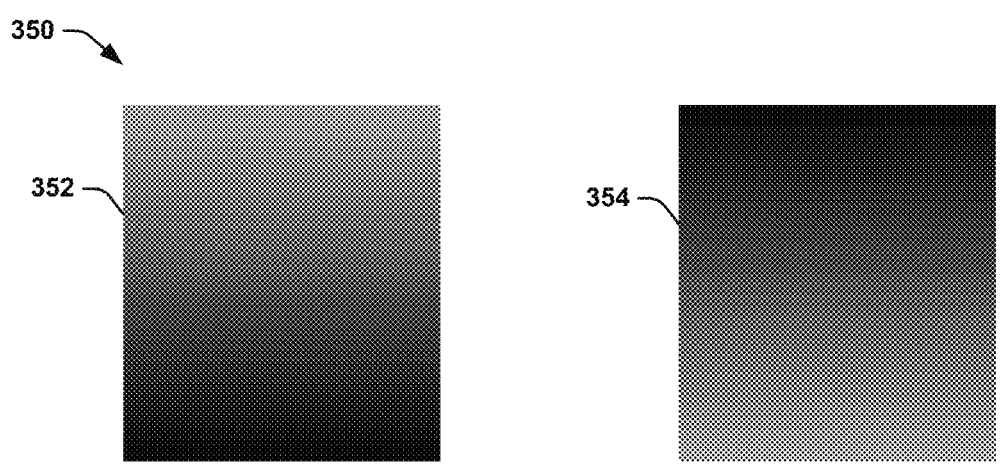
FIG. 8 illustrates another example diagram of cross-sectional views of magnetic field gradients.

FIG. 8 illustrates an example diagram 350 of cross-sectional views of magnetic field gradients. The diagram 350 includes a first magnetic field gradient 352 and a second magnetic field gradient 354 that are distributed across a cross-section "B" of the vapor cell 302 along the central axis 310 (i.e., the X-Y plane). The first magnetic field gradient 352 can correspond to a local magnetic field gradient that results, at least in part, from depolarization of the alkali metal atoms in the vapor cell 302 resulting from interaction with the wall at the first end 316 of the vapor cell 302 through which the optical pump beam $OPT_{PMP}$ passes and/or diffusion of the alkali metal atoms in the vapor cell 302. The second magnetic field gradient 354 can correspond, for example, to the magnetic field gradient generated by the magnetic field trimming system 304 in the example of FIG. 7. In the example of FIG. 8, the diagram 350 demonstrates greater magnetic field intensities at darker shaded portions of the magnetic field gradients 352 and 354 and lesser magnetic field intensities at lighter shaded portions of the magnetic field gradients 352 and 354.

The first magnetic field gradient 352 thus demonstrates the local magnetic field having a greatest intensity at the first end 316 of the vapor cell 302 and having decreasing intensity away from the first end 316, with a least intensity at the second end 318. Similarly, second magnetic field gradient 354 demonstrates the magnetic field generated by the magnetic field trimming system 304 having a least intensity at the first end 316 of the vapor cell 302 and having increasing intensity away from the first end 316, with a greatest intensity at the second end 318. Accordingly, the second magnetic field gradient 354 can be generated approximately equal and opposite the first magnetic field gradient 352 that results from depolarization of the alkali metal atoms resulting from interaction with the wall at the first end 316 of the vapor cell 302 through which the optical pump beam $OPT_{PMP}$ passes and/or diffusion of the alkali metal atoms in the vapor cell 302. It is to be understood that the magnetic field gradient 354 is generated by the first magnetic field trimming system 304 to counteract the local magnetic field gradient with respect to the first end 316 of the vapor cell 302. Thus, a magnetic field gradient that is generated by the second magnetic field trimming system 306 can be generated that is an approximate mirror image of the magnetic field gradient 354 about a plane centered on the vapor cell 302 and parallel to the X-Y plane. Thus, the magnetic field gradient generated by the second magnetic field trimming system 306 can substantially counteract a local magnetic field gradient with respect to the second end 318 of the vapor cell 302, such as an approximate minor image of the magnetic field gradient 352 about a plane centered on the vapor cell 302 and parallel to the X-Y plane.

Figure 9:
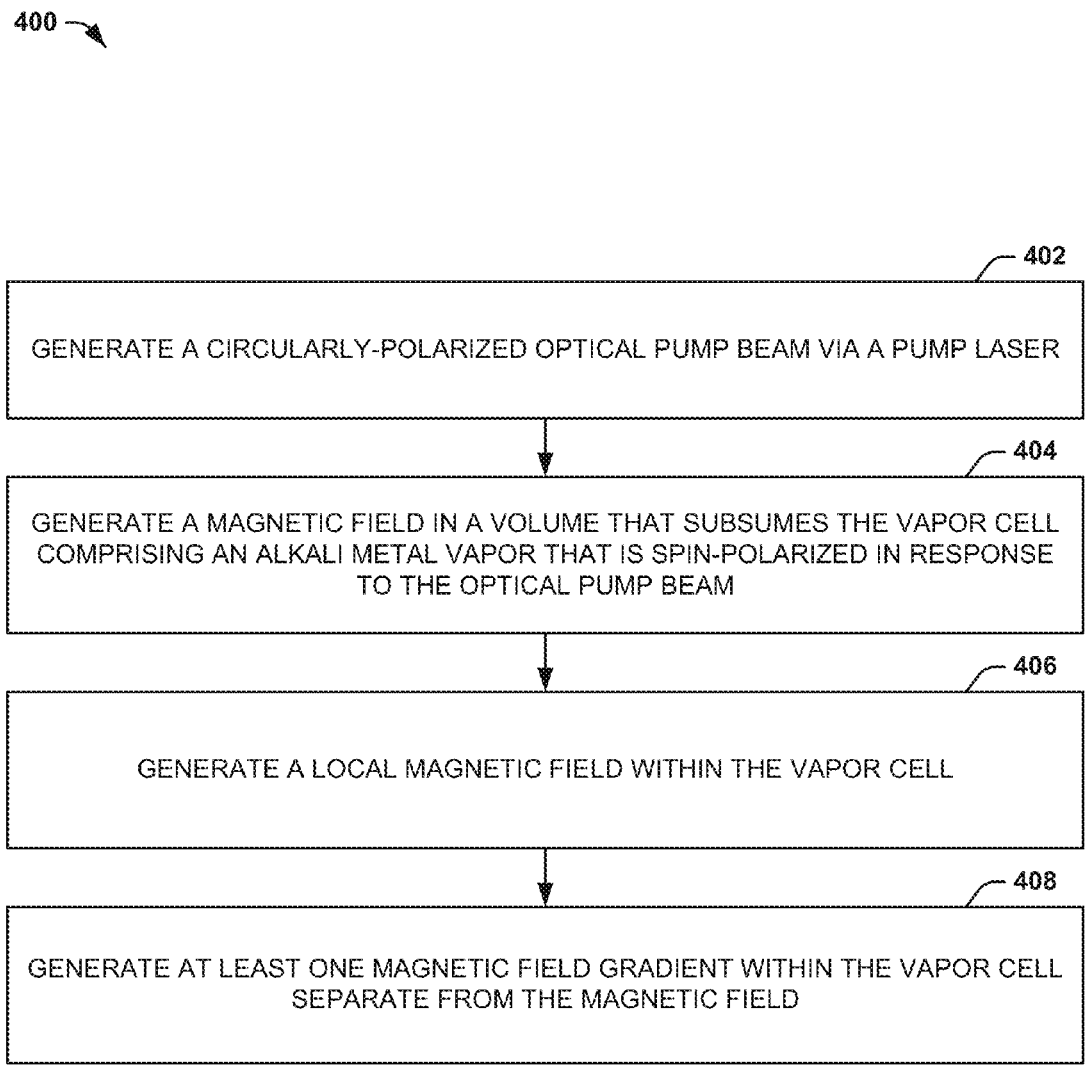
FIG. 9 illustrates an example of a method for generating a substantially uniform collective magnetic field in a vapor cell of an atomic sensor.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates an example of a method 400 for generating a substantially uniform collective magnetic field in a vapor cell (e.g., the vapor cell 14) of an atomic sensor system (e.g., the atomic sensor system 10). At 402, a circularly-polarized optical pump beam (e.g., the optical pump beam $OPT_{PMP}$) is generated via a pump laser (e.g., the pump laser 12). At 404, a magnetic field (e.g., the magnetic field $B_Z$) is generated in a volume that subsumes the vapor cell comprising an alkali metal vapor that is spin-polarized in response to the optical pump beam. At 406, a local magnetic field is (e.g., the magnetic field gradient 252) generated within the vapor cell. At 408, at least one magnetic field gradient (e.g., the magnetic field gradient 152) within the vapor cell separate from the magnetic field. The magnetic field gradient can have an intensity that is substantially equal and opposite the local magnetic field to provide the substantially uniform collective magnetic field in the vapor cell.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An atomic sensor system comprising:
   a magnetic field generator configured to generate a magnetic field in a volume;
   a vapor cell arranged within the volume and comprising a polarized alkali metal vapor; and
   at least one magnetic field trimming system configured to generate a magnetic field gradient within the vapor cell separate from the magnetic field to provide a substantially uniform collective magnetic field within the vapor cell.

2. The system of claim 1, further comprising a pump laser configured to generate an optical pump beam, wherein the alkali metal vapor is spin-polarized in response to the optical pump beam to generate a local magnetic field within the vapor cell, wherein the magnetic field gradient is substantially equal and opposite the local magnetic field.

3. The system of claim 2, wherein the at least one magnetic field trimming system comprises:
   a first magnetic field trimming system configured to generate a first magnetic field gradient having a greatest intensity proximal to at least one internal side-edge of the vapor cell and decreasing away from the at least one internal side-edge;
   a second magnetic field trimming system configured to generate a second magnetic field gradient having a greatest intensity at an internal edge of a first end of the vapor cell that is orthogonal to the optical pump beam and decreasing away from the internal edge of the first end of the vapor cell; and
   a third magnetic field trimming system configured to generate a third magnetic field gradient having a greatest intensity at an internal edge of a second end of the vapor cell opposite the first end and decreasing away from the internal edge of the second end of the vapor cell.

4. The system of claim 1, further comprising a pump laser configured to generate an optical pump beam, wherein the at least one magnetic field trimming system comprises a first coil and a second coil arranged coaxial and in series with respect to each other and configured to conduct a current to generate the magnetic field gradient.

5. The system of claim 4, wherein the first and second coils are arranged planar with respect to each other are configured to conduct the current in opposite directions with respect to each other, and wherein at least one of the first coil and the second coil has a geometric shape that substantially matches a cross-sectional geometric shape of the vapor cell to generate the magnetic field gradient as having a greatest intensity at internal edges of the vapor cell and decreasing away from the internal edges.

6. The system of claim 4, wherein the vapor cell has an approximately square-shaped cross-section orthogonal to propagation of the optical pump beam, wherein the first coil and the second coil are arranged planar with respect to a first end of the vapor cell through which the optical pump beam is incident, wherein the first and second coils cooperate to generate the magnetic field gradient having a greatest intensity at each corner of the first end of the vapor cell and decreasing away from each corner of the first end within the vapor cell.

7. The system of claim 4, wherein the first coil and the second coil are further configured to cooperate to generate the magnetic field gradient as having a least intensity at a cross-sectional center of the vapor cell and increasing toward the internal edges in response to a substantially Gaussian cross-sectional intensity of the optical pump beam.

8. The system of claim 4, wherein the first coil and the second coil of each of the at least one magnetic field trimming system are arranged in parallel planes that are offset by a predetermined distance and are respectively located proximal to at least one of a first end of the vapor cell and a second end of the vapor cell, wherein the first and second coils are configured to generate a first magnetic field and a second magnetic field, respectively, that cooperate to generate the magnetic field gradient based on the first magnetic field having a greater magnetic flux density than the second magnetic field and the second magnetic field having a greater magnetic moment than the first magnetic field.

9. The system of claim 8, wherein the first coil and the second coil of each of the at least one magnetic field trimming system are arranged to generate the magnetic field gradient as having a greatest intensity at the respective one of the first and second ends of the vapor cell and decreasing away from the respective one of the first and second ends of the vapor cell.

10. At least one of an NMR gyroscope system, an atomic magnetometer system, and an accelerometer system comprising the atomic sensor system of claim 1.

11. A method for generating a substantially uniform collective magnetic field in a vapor cell of an atomic sensor system, the method comprising:

generating a circularly-polarized optical pump beam via a pump laser;
generating a magnetic field in a volume that subsumes the vapor cell comprising an alkali metal vapor that is spin-polarized in response to the optical pump beam;
generating a local magnetic field within the vapor cell; and
generating at least one magnetic field gradient within the vapor cell separate from the magnetic field, the magnetic field gradient having an intensity that is substantially equal and opposite the local magnetic field to provide the substantially uniform collective magnetic field in the vapor cell.

12. The method of claim 11, wherein generating the magnetic field gradient comprises generating the magnetic field gradient having a greatest intensity proximal to at least one internal side-edge of the vapor cell and decreasing away from the at least one internal side-edge.

13. The method of claim 12, wherein the first coil and the second coil are further configured to cooperate to generate the magnetic field gradient as having a least intensity at a cross-sectional center of the vapor cell and increasing toward the internal edges in response to a substantially Gaussian cross-sectional intensity of the optical pump beam.

14. The method of claim 11, wherein generating the magnetic field gradient comprises generating the magnetic field gradient having a greatest intensity at an internal edge of a first end of the vapor cell that is orthogonal to the optical pump beam and decreasing away from the internal edge of the first end of the vapor cell.

15. The method of claim 14, wherein the magnetic field gradient is a first magnetic field gradient, wherein generating the magnetic field gradient further comprises generating a second magnetic field gradient having a greatest intensity at an internal edge of a second end of the vapor cell opposite the first end and decreasing away from the internal edge of the second end of the vapor cell.

16. The method of claim 11, wherein generating the magnetic field gradient comprises providing a current through a first coil and a second coil arranged coaxial and in series with respect to each other and in opposite directions with respect to each other.

17. An atomic sensor system comprising:
a pump laser configured to generate an optical pump beam;
a magnetic field generator configured to generate a magnetic field in a volume;
a vapor cell arranged within the volume and comprising an alkali metal vapor that is spin-polarized in response to the optical pump beam;
a first magnetic field trimming system configured to generate a first magnetic field gradient independent of the magnetic field having a greatest intensity proximal to at least one internal side-edge of the vapor cell and decreasing away from the at least one internal side-edge;
a second magnetic field trimming system configured to generate a second magnetic field gradient independent of the magnetic field having a greatest intensity at an internal edge of a first end of the vapor cell that is orthogonal to the optical pump beam and decreasing away from the internal edge of the first end of the vapor cell; and
a third magnetic field trimming system configured to generate a third magnetic field gradient independent of the magnetic field having a greatest intensity at an internal edge of a second end of the vapor cell opposite the first end and decreasing away from the internal edge of the second end of the vapor cell.

18. The system of claim 17, wherein the spin-polarization of the alkali metal vapor generates a local magnetic field within the vapor cell, wherein the first, second, and third magnetic field gradients are generated to have a collective intensity that is substantially equal and opposite the local magnetic field.

19. The system of claim 17, wherein the first magnetic field trimming system comprises a first coil and a second coil arranged coaxial, coplanar, and in series with respect to each other and configured to conduct a current in opposite directions through the first and second coils to generate the first magnetic field gradient.

20. The system of claim 17, wherein each of the second and third magnetic field trimming system comprises a first coil and a second coil that are arranged in series and in parallel planes with respect to each other that are each orthogonal to the optical pump beam and are offset by a predetermined distance, the first and second coils being configured to conduct a current in opposite directions through the first and second coils to generate the respective second and third magnetic field gradients, wherein the second magnetic field trimming system is located at a first end of the vapor cell and wherein the third magnetic field trimming system is located at a second end of the vapor cell, wherein the first and second coils in each of the second and third magnetic field trimming systems are configured to generate a first magnetic field and a second magnetic field, respectively, that cooperate to generate the respective second and third magnetic field gradients based on the first magnetic field having a greater magnetic flux density than the second magnetic field and the second magnetic field having a greater magnetic moment than the first magnetic field.

* * * * *